US005796018A

United States Patent [19]

Moyer et al.

[11] Patent Number: 5,796,018
[45] Date of Patent: Aug. 18, 1998

[54] PROCESS FOR COATING IRON PARTICLES WITH PHOSPHORUS AND FORMING COMPACTED ARTICLES

[75] Inventors: Kenneth H. Moyer, Cinnaminson; David J. Geveke, Milltown; Thomas R. Parr, South Bound Brook; Robert B. Roaper, Martinsville, all of N.J.

[73] Assignees: Procedyne Corp., New Brunswick; Magna-Tech P/M Labs., Cinnaminson, both of N.J.

[21] Appl. No.: 790,711

[22] Filed: Jan. 29, 1997

[51] Int. Cl.$^6$ ............ B22F 1/02; B22F 3/12; C22C 33/02; C22C 38/00
[52] U.S. Cl. ............ 75/230; 75/246; 75/255; 75/953; 419/10; 419/35; 419/38; 427/213; 427/216; 427/217; 427/250; 427/252; 29/DIG. 31
[58] Field of Search .............. 427/212, 213, 427/216, 217, 248.1, 250–252; 419/10, 35, 38, 39, 46; 75/230, 246, 255, 953, 950; 148/513; 29/DIG. 31; 428/570, 402

[56] References Cited

U.S. PATENT DOCUMENTS

| | | | |
|---|---|---|---|
| 1,836,746 | 12/1931 | Beckinsale et al. | 419/35 |
| 3,202,537 | 8/1965 | Norman et al. | 117/100 |
| 3,247,014 | 4/1966 | Goldberger et al. | 117/100 |
| 3,447,950 | 6/1969 | Evans et al. | 117/100 |
| 3,552,955 | 1/1971 | Martyniuk | 75/212 |
| 3,591,362 | 7/1971 | Benjamin | 75/0.5 BA |
| 4,155,748 | 5/1979 | Steck et al. | 75/0.5 AA |
| 4,291,070 | 9/1981 | Brown et al. | 427/213 |
| 4,295,879 | 10/1981 | Steck et al. | 75/0.5 AA |
| 4,323,395 | 4/1982 | Li | 75/212 |
| 4,729,785 | 3/1988 | Schwab et al. | 75/0.5 AA |
| 4,746,547 | 5/1988 | Brown et al. | 427/213 |
| 4,788,080 | 11/1988 | Hojo et al. | 427/204 |
| 4,944,985 | 7/1990 | Alexander et al. | 428/570 |
| 5,225,459 | 7/1993 | Oliver et al. | 523/220 |
| 5,352,286 | 10/1994 | Schmid et al. | 106/404 |
| 5,474,605 | 12/1995 | Schmid et al. | 106/404 |
| 5,478,409 | 12/1995 | Takahashi | 148/104 |
| 5,489,449 | 2/1996 | Umeya et al. | 427/450 |
| 5,585,032 | 12/1996 | Nakata et al. | 252/62.62 |
| 5,603,815 | 2/1997 | Lashmore et al. | 204/222 |

*Primary Examiner*—Daniel J. Jenkins
*Attorney, Agent, or Firm*—Kane, Dalsimer, Sullivan, Kurucz, Levy, Eisele and Richard LLP

[57] ABSTRACT

Ferrous powder particles are coated with vaporized phosphorus in a fluid-bed reactor to obtain homogeneous coatings of phosphorus. The coated powders are useful feed for pressed structural parts, exhibiting improved green density, compressibility and sintered density thus improving magnetic and tensile properties.

20 Claims, No Drawings

PROCESS FOR COATING IRON PARTICLES WITH PHOSPHORUS AND FORMING COMPACTED ARTICLES

BACKGROUND OF THE INVENTION

1. Field of the Invention

The invention relates to powder metallurgy (P/M) and to a process for coating of particles and more particularly to a process for coating iron particles with phosphorus.

2. Brief Description of Related Art

Phosphorus alloyed with iron has been known to enhance the magnetic properties of devices manufactured from the alloys such as solenoids, relays and small electric motors; see for example Bozorth, Ferromagnetism, D. Van Nostrand Company, Inc., 1961 pp 251-253. It has also been well known that if phosphorus was alloyed with iron powder by admixing a ferrophosphorus compound powder with iron powder, and compacting the mixture into a green part of required size and dimensions, that the tensile strength of the part would be enhanced upon sintering (U.S. Pat. No. 2,226,520). However, little use was made of this knowledge because if phosphorus were alloyed with iron and wrought ingots were hot rolled, the ingot would become "hot short" (break up).

At the time, water atomized iron powders had not been developed. Powders that existed were reduced from ore, and therefore contained large quantities of impurities. Other iron powders were available, such as carbonyl iron and powders made by the electrolytic process. However, these higher purity iron powders were expensive. Therefore, even though phosphorus was known to be beneficial as an alloying agent, little commercial use was made of the knowledge.

By 1970, however, processes were developed that produced high purity, high compressibility, water atomized iron powders. It now became possible to produce pressed and sintered parts from phosphorus alloyed with iron powder that permitted improvements in magnetic and tensile properties. Several U.S. patents were then issued that took advantage of the concept of admixing a fine ferrophosphorus powder with high compressibility, high purity water atomized iron powder to produce pressed parts that included phosphorus as an alloying agent (U.S. Pat. Nos. 3,830,355; 4,090,868; 4,126,452; 4,190,441; 4,483,905; 4,603,028; 4,115,158; 4,152,179; 4,236,945). The process developed generally consisted of admixing a ferrophosphorus compound such as $Fe_3P$ or $Fe_2P$ with water atomized iron powder. The particle size of the ferrophosphorus was important. Several of the patents limited the particle size to 10 microns or less. Several patents maintained that $Fe_3P$ was more forgiving in respect to die wear and tool breakage. After admixing the powders and including a lubricant to facilitate removal of compacted parts from the die, the green compacts that were produced were sintered to produce parts of consistent geometry and close tolerances. The ferrophosphorus yielded an additional advantage because a liquid phase was produced when the compact was heated to a temperature of 1920° F. (1050° C.). The liquid phase permitted the ferrophosphorous particles to melt and diffuse into the iron matrix. The sintered parts therefore had higher densities resulting in higher magnetic induction and tensile strength. The higher resistivity and improved purity of the parts also improved structure sensitive magnetic properties (permeability and coercive field), ductility, and toughness.

Despite these major improvements, many limitations existed that restricted further improvements in the pressed and sintered finished products. Mostly these restrictions dealt with the particle size of the ferrophosphorus powder. Practically, these powders could be ground only so fine without resulting in contamination of the powder. Both large particle size and contamination result in production of pressed and sintered products that have less than optimum properties.

In the publications K. H. Moyer and J. B. Ryan, "A Beginning Toward Understanding Phosphorus Irons", Advances In Powder Metallurgy, 1989, Volume 1, Metal Powder Industries Federation, 105 College Road East, Princeton, N.J., pp 163, 173 and Kenneth H. Moyer "Selection Of Powders And Processing For P/M Soft Magnetic Components" Advances In Powder Metallurgy, 1990, Volume 2, Metal Powder Industries Federation, 105 College Road East, Princeton, N.J., pp 385-399 it was shown that the condition of the ferrophosphorus particles is important if optimum properties are to be obtained. If surface contamination levels are excessive, diffusion of the phosphorus into the iron matrix is impeded, resulting in less densification and degraded magnetic and tensile properties. If the ferrophosphorus particles are too large, when the particles melt they leave behind large pores, and the liquid phase cascades along particle and grain boundaries, causing damage and resulting in degraded properties. Also, the ferrophosphorus particles, on the order of 10 microns, are extremely fine in size and are subject to dusting when the powder is transferred. Fine dust is a hazard to the environment and also may result in health problems for the workers.

If a process could be developed that circumvents these problems by eliminating the fine ferrophosphorus powder, improved products could be produced under conditions more friendly to the environment. If the phosphorus were in intimate contact with the surface of the iron powder, these results could be accomplished. The present process that was developed, and that is considered unique in nature, was designed to accomplish these objectives and to eliminate the problems that result from admixing fine ferrophosphorus particles with iron, such as occurs in present production processes. A process has now been developed whereby all of the limitations of the earlier art can be alleviated. This process involves fluidizing a bed of iron powder particles, heating the powder to a desired temperature after hydrogen has been introduced to reduce oxides and other impurities that may exist on the surface of the iron powder, and then introducing a vapor of phosphorus to coat the surface of the iron particles contained within the fluidized bed. These coated particles can then be admixed with a lubricant to facilitate removal from a pressing die and can be compacted to manufacture structural parts that have higher green density and that can be extracted from the die with greater facility permiting less wear and tool breakage. When sintered, the phosphorus, homogeneously deposited on the surface of the iron particles, readily diffuses into the ferrite of the iron matrix without leaving large pores and without damage to the grain boundaries. Sintered density and contamination levels within the sintered parts are markedly improved, resulting in improvement in magnetic and tensile properties.

SUMMARY OF THE INVENTION

The invention comprises a process for coating particles of a ferrous powder with phosphorus, which comprises;

providing a fluidized bed of the ferrous particles;

introducing a reducing gas atmosphere into the fluidized bed; and coating the particles in the bed with phosphorus.

The invention also comprises the coated particles and their use in preparing compacted and sintered parts.

DETAILED DESCRIPTION OF THE INVENTION

The innovative process that has been developed consists of fluidizing a bed of ferrous powder in a conventional fluid-bed reactor. The fluidizing gas medium may be hydrogen, an inert noble gas such as argon, or a mixture thereof. When the bed is fluidized, a reducing gas such as hydrogen (if not the fluidizing gas) is admitted to the bed and the bed temperature is elevated sufficiently to effect a reduction of contamination on the surface of the fluidized ferrous particles and to anneal the particles. Phosphorus is then introduced into the fluidized bed of powder in the vapor state. The phosphorus vapor deposits on the hydrogen reduced surfaces of the ferrous powder thereby forming a homogeneous phosphorus coating on the surface of the particles of ferrous powder. The flow rate of the phosphorus vapor and the temperature and time required to coat the ferrous powder with a uniform coating of phosphorus is sufficient to produce phosphorus concentrations ranging from 0.1 w/o to 2 w/o (within tolerances required by today's commercial market); preferably 0.3 to 1.0 w/o. Purity levels of the ferrous powder are improved by reduction of surface contamination on the iron powder and by deposition of the pure phosphorus from the vapor phase onto the clean, active surface of the ferrous powder. The efficiency or utilization of the phosphorus for the fluid bed vapor deposition process is excellent (greater than 99.8%). All of the phosphorus coated ferrous product is retained within the fluid bed vessel and does not contaminate the environment. That is, product is not entrained with the off gas. In addition, the process is reproducible and can be scaled-up.

When compacted in a molding press, the coated powder product by the process of the invention produces green parts with higher green density and requires less pressure to eject the parts from the die. The higher green density usually ensures that when the parts are sintered the sintered density will also be higher. The lower pressure required to remove the parts from the die results in less die wear and less breakage of expensive dies. Owing to the phosphorus being in intimate contact with the ferrous powder, and reduction of impurities that restrict sintering, diffusion occurs more readily, thereby enhancing the sinterability of parts. Higher sintered density is achieved. The higher sintered density causes the magnetic induction to be enhanced and the tensile and yield strength to increase. Elimination of impurities results in improved structure sensitive magnetic properties (permeability and coercive field), improved ductility and improved toughness. In addition, since there are no free ferrophosphorus particles present, no unnaturally generated large pores exist and damage to grain boundaries that restrict sintering are reduced. The coated powder is more friendly to the environment and to the health of the workers because the dusting resulting from admixing the fine ferrophosphorus particles is eliminated.

Fluidized bed reactors are well known in commerce. The ferrous powders employed in the process of the invention are also well known and commercially available. Preferred ferrous powders are the water-atomized iron powders. Advantageously, the powders have a particle size of –60 mesh; preferably, for the conventional P/M parts, 100 mesh, and for metal injection molding (MIM), <10 micron for 90% of the particles.

Coating of the ferrous particles occurs on the hydrogen reduced particle surfaces when phosphorus in a vapor form permeates the fluidized bed and deposits on the particle surfaces. The phosphorus may be obtained in vapor form by sublimation of solid phosphorus. For example, red phosphorus sublimes at a temperature of about 416° C. (780° F.). Although red phosphorus is a preferred source of phosphorus vapor, other allotropic forms can be employed. Phosphorus containing gases such as phosphine are also phosphorus sources for use in the process of the invention. The fluidized bed may be maintained at a temperature of from about 300° C. (570° F.) to 600° C. (1112° F.), preferably 400C. (752° F.) to 500OC. (932° F.) during the application of the phosphorus coating.

In one embodiment of the process of the invention, phosphorus gas is supplied by passing a carrier gas through solid phosphorus to increase efficiency and control phosphorus addition to the fluidized bed. Thus, the vapor form of the phosphorus is fed directly to a fluidized bed of ferrous particles through a distributor arrangement mounted in the fluidized bed. This sublimer may be positioned internally within the fluid bed reactor to further improve efficiency of the phosphorus vapor addition to the fluid bed.

The following examples show the manner and process of carrying out the invention, but are not to be construed as limiting.

EXAMPLE 1

A fluidized bed was loaded with water atomized iron powder. Hydrogen gas was introduced into the fluidized bed of iron powder and the bed temperature was elevated to 840° F., (450° C.). The temperature was maintained for 15 minutes. Contamination levels of the powder were reduced as shown in the Table below:

| Element ppm | Atomized Iron Powder | Fluid Bed Product |
|---|---|---|
| Carbon | 14 | 16 |
| Nitrogen | 12 | 4 |
| Oxygen | 875 | 335 |
| Sulphur | 26 | 23 |

The Table indicates that the process of the invention reduces impurity levels of the ferrous powders to exceptionally low concentrations.

EXAMPLE 2

A given quantity of ferrous powder was admixed with $Fe_3P$, (10 micron powder) sufficient to yield 0.45 phosphorus when it was sintered. A second quantity of iron powder was loaded into a fluidized bed; the bed chamber was purged and hydrogen was introduced. The fluidized iron powder was then heated to 840° F. (450° C.) and phosphorus vapor was introduced to the heated bed of iron powder for 17.5 minutes to coat the surface of the iron powder with 0.45 w/o phosphorus. The two powders prepared were examined by scanning electron microscope (SEM).

One set of SEM photographs shows the topography of the iron powder that was simply admixed with the $Fe_3P$ powder for comparison. It can be readily seen that the phosphorus is not homogeneously dispersed. The second set of SEM photographs shows the topography of the iron powder that was coated with the phosphorus in a fluidized bed, according to the process of the invention. Clearly the phosphorus may be seen as homogeneously deposited on the surface of the iron particles.

EXAMPLE 3

This example demonstrates that the phosphorus content of the coated iron powder is controlled by the amount of time the vaporized phosphorus is supplied to the fluidized bed of iron powder. A series of tests were made whereby the iron powder was loaded into a chamber and fluidized. Hydrogen was then introduced and the fluidized bed was heated to 840° F. (450° C.). Phosphorus was then introduced as a vapor into the fluidized bed. The example shows that the phosphorus coated on the iron powder is a linear function of the treatment time.

EXAMPLE 4

A blend of iron powder with sufficient $Fe_3P$ (10 micron powder) was made to yield 0.45 w/o phosphorus after sintering. This blend and a second quantity of fluid bed processed phosphorus coated powder were each admixed with 0.5 w/o ethylene bisstearamide to provide lubrication to remove the parts from the die after compaction. Specimens 0.5 by 1.25 by 0.25 inches were compacted from these powder blends at 50 TSI (680 Mpa). The results of these tests are shown below:

| Blend | Green Density g/cm³ | Extraction Force Pounds |
|---|---|---|
| Admixed $Fe_3P$ | 7.13 | 3900 |
| Phosphorus Coated | 7.17 | 2100 |

The data show that by hydrogen annealing and coating the iron powder with phosphorus in a fluidized bed furnace, particles are produced that are softer and therefore more compressible. The green density of the parts is therefore enhanced. When the green density is enhanced, the sintered density is also usually enhanced. Higher sintered density results is higher magnetic induction and higher tensile and yield strength. It is also readily seen that the force required to remove parts fabricated from phosphorus coated powder is markedly lower. Lower stripping force results in less die wear over the life of the die and also results in less breakage of expensive tooling.

EXAMPLE 5

An admixed blend consisting of iron and sufficient $Fe_3P$ powder to provide 0.45 w/o phosphorus on sintering and a 0.45 w/o phosphorus coated powder were compacted at 50 TSi (680 MPa) into rings. These rings were then sintered at 1260° C. (2300° F.) for one hour in a partial pressure of hydrogen. The resulting magnetic properties are compared below:

| Property | Admixed Powder | Fluid-Bed Coated Powder |
|---|---|---|
| Magnetic induction at an applied field of 15 oersteds (gauss) | 13,500 | 14,100 |
| Remnant Magnetization (gauss) | 13,000 | 13,400 |
| Relative Maximum Permeability | 6,000 | 6,200 |
| Coercive Force (oersteds) | 1.0 | 1.1 |
| Sintered Density (g/cm3) | 7.42 | 7.56 |

The data above clearly show the advantages of sintering phosphorus coated powder where the phosphorus is prepared by the process of the invention and is in intimate contact with the iron matrix. Owing to the cleanliness of the iron surface, stemming from annealing the iron powder to reduce surface contamination, and the intimacy of the coated phosphorus with the surface of the iron matrix, the sintered density of the rings fabricated from the phosphorus coated powder is markedly increased. Owing to the higher sintered density, the magnetic induction and the remnant magnetization are also increased because they are a linear function of the sintered density. In this case, the structure sensitive properties (relative maximum permeability and coercive field) are not significantly improved, however, they are equal or slightly improved when compared with the properties of the rings fabricated from the admixed powders.

EXAMPLE 6

Tensile specimens were compacted from the same blends described in Example 5, supra. They were also sintered under the same conditions as were described in Example 5. The properties resulting from these tensile tests are shown below:

| Property | Admixed Powder | Phosphorus Coated Powder |
|---|---|---|
| Tensile Strength (psi) | 43,300 | 51,800 |
| Yield Strength (psi) | 33,300 | 33,300 |
| Elongation (% in 1 inch) | 8.0 | 15.0 |
| Sintered Density (g/cm3) | 7.39 | 7.44 |
| Change from Die Size (%) | −0.002 | −0.15 |

The above data again demonstrate the advantages of using phosphorus coated powder produced by the method of the invention instead of a simple admixed blend of iron and $Fe_3P$ powder. Again, because the iron particles were annealed and purified prior to coating the surface with phosphorus, and because the phosphorus was in intimate contact with the surface of the iron powder, tensile properties were significantly improved. The tensile strengths of the specimens sintered from the coated powder were markedly higher. The yield strength was unchanged, however the elongation, a measure of the ductility and of the toughness doubled. Shrinkage of the part increased, but this increased shrinkage can be compensated for in die design or by slight altering of the sintering conditions.

What is claimed is:

1. A process for coating particles of a ferrous powder with phosphorus, which comprises;
   providing a fluidized bed of the ferrous particles;
   introducing a reducing gas atmosphere into the fluidized bed; and
   coating the particles in the bed with phosphorus vapor.

2. The process of claim 1, wherein the reducing gas is hydrogen and the particles are heated to a temperature sufficient to reduce surface contamination.

3. The process of claim 1 wherein the fluidized particles consist of unannealed ferrous powder which are heated to a temperature sufficient to reduce surface contamination and to anneal the particles.

4. The process of claim 1 wherein phosphorus is introduced to deposit a homogeneous coating of phosphorus ranging from 0.1 to 2 w/o phosphorus.

5. The process according to claim 1 wherein a fluid bed furnace is employed to fluidize the ferrous particles.

6. A process for coating particles of a ferrous powder with phosphorus comprising;

(a) fluidizing a bed of the ferrous particles;

(b) introducing a reducing gas atmosphere into the fluidized bed to anneal and to remove surface impurities including at least a portion of the surface oxide from the ferrous particles;

(c) introducing vapors of phosphorus into the fluidized bed of reducing gas treated ferrous particles; and (d) depositing phosphorus vapors on the surface of the ferrous particles in the fluidized bed to form a coating of phosphorus.

7. A process for coating particles of a ferrous powder with phosphorus comprising:

(a) fluidizing a bed of the ferrous particles;

(b) introducing a reducing gas atmosphere into the fluidized bed to anneal and to remove surface impurities including at least a portion of the surface oxide from the ferrous particles;

(c) introducing vapors of phosphorus into the fluidized bed of reducing gas treated ferrous particles; said vapors of phosphorus being produced by subliming solid phosphorus in a sublimer; and (d) depositing phosphorus vapors on the surface of the ferrous particles in the fluidized bed to form a coating of phosphorus.

8. The process according to claim 7 wherein the phosphorus gas is supplied by passing a carrier gas through solid phosphorus to increase efficiency and control of phosphorus addition to the fluidized bed.

9. The process according to claim 6 wherein the deposited phosphorus is provided by introducing phosphine to the fluidized bed.

10. The process of claim 7 where phosphorus gas is fed directly to a fluidized bed of ferrous particles through a distributor arrangement mounted in the fluidized bed.

11. The process of claim 7 where the phosphorus gas is fed into the fluidizing gas of the fluid bed.

12. The process according to claim 7 wherein the sublimer is positioned internally within the fluid bed reactor to improve efficiency of the phosphorus addition to the fluid bed.

13. The product of the process of claim 1.

14. The process of claim 6 wherein the product phosphorus vapor coated powder is compacted at pressures ranging from 10 to 70 TSI to yield green parts that have densities of 7.1 to 7.2 q/cm$^3$, that require pressures of approximately 2,400 lb at 50 TSI, to be removed from dies.

15. The product of the process of claim 14.

16. The process of claim 14 wherein parts compacted from the phosphorus coated powder are sintered.

17. The product of claim 16.

18. The process of claim 16 wherein parts sintered from the phosphorus vapor coated powder have improved structure sensitive magnetic properties (relative maximum permeability, approximately 10,000, and coercive field), as low as 0.7 oersteds, when compacted and sintered.

19. The process of claim 16 wherein parts sintered from the phosphorus vapor coated powder have improved tensile strength, as high as 55,000 psi, resulting in sintered density of as high as 7.6 gm/cm$^3$.

20. The process of claim 16 wherein phosphorus vapor coated iron powder is compacted and sintered under identical conditions to those used with admixed solid powder, to produce parts that have improved ductility (elongation, as high as 28%).

* * * * *